US005453713A

United States Patent [19]
Partovi et al.

[11] Patent Number: 5,453,713
[45] Date of Patent: Sep. 26, 1995

[54] NOISE-FREE ANALOG ISLANDS IN DIGITAL INTEGRATED CIRCUITS

[75] Inventors: Hamid Partovi, Westboro, Mass.; Andrew J. Barber, Kettering, Ohio

[73] Assignee: Digital Equipment Corporation, Maynard, Mass.

[21] Appl. No.: 239,438

[22] Filed: May 6, 1994

Related U.S. Application Data

[63] Continuation of Ser. No. 909,550, Jul. 6, 1992.
[51] Int. Cl.$^6$ ..................................................... H01L 27/06
[52] U.S. Cl. .......................... 327/565; 257/519; 257/552
[58] Field of Search ......................... 328/158; 307/303.1, 307/303.2, 494, 497, 498, 303, 491, 304; 257/500, 552, 370, 372, 499, 501, 519

[56] References Cited

U.S. PATENT DOCUMENTS

| | | | |
|---|---|---|---|
| 3,978,473 | 8/1976 | Pastoriza | 307/303.1 |
| 4,628,343 | 12/1986 | Komatsu | 357/84 |
| 5,023,689 | 6/1991 | Sugawara | 257/372 |
| 5,081,517 | 1/1992 | Contiero et al. | 257/370 |
| 5,107,138 | 4/1992 | Seki et al. | 307/296.1 |
| 5,132,555 | 7/1992 | Takahashi | 307/296.1 |
| 5,212,458 | 5/1993 | Fitzpatrick et al. | 330/288 |

*Primary Examiner*—Timothy P. Callahan
*Assistant Examiner*—My-Trang Nu Ton
*Attorney, Agent, or Firm*—Arthur W. Fisher; Denis G. Maloney; Mark J. Casey

[57] ABSTRACT

An integrated circuit chip has both digital and analog circuit functions, with one or more islands for isolating the analog functions from noise caused by the digital functions. An island is defined by a surrounding heavily-doped region in the face of the chip. The voltage supplies for an analog island are isolated from the digital supply voltage for high frequencies by using resistive decoupling in series along with capacitive coupling to ground. Similarly, series resistive decoupling and capacitive coupling to ground are employed for the analog input signal lines going to the island. Analog signals generated within the island are coupled to the area outside the island on the chip face by either converting to digital in an A-to-D converter, or by a differential arrangement which accounts for differences that may exist between digital and analog supply voltages. The differential circuit may have a pair of matched inputs, one side supplied by the analog voltage supply and the other by the digital voltage supply, and a differential amplifier generating the output signal and also fed back to the one side of the matched input.

9 Claims, 3 Drawing Sheets

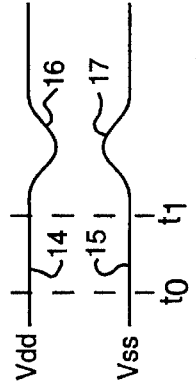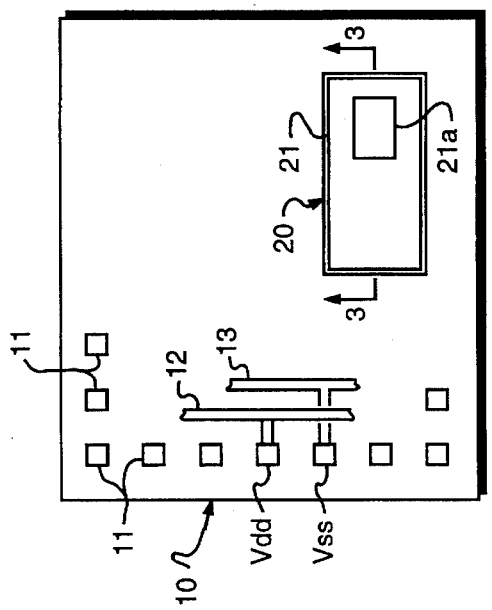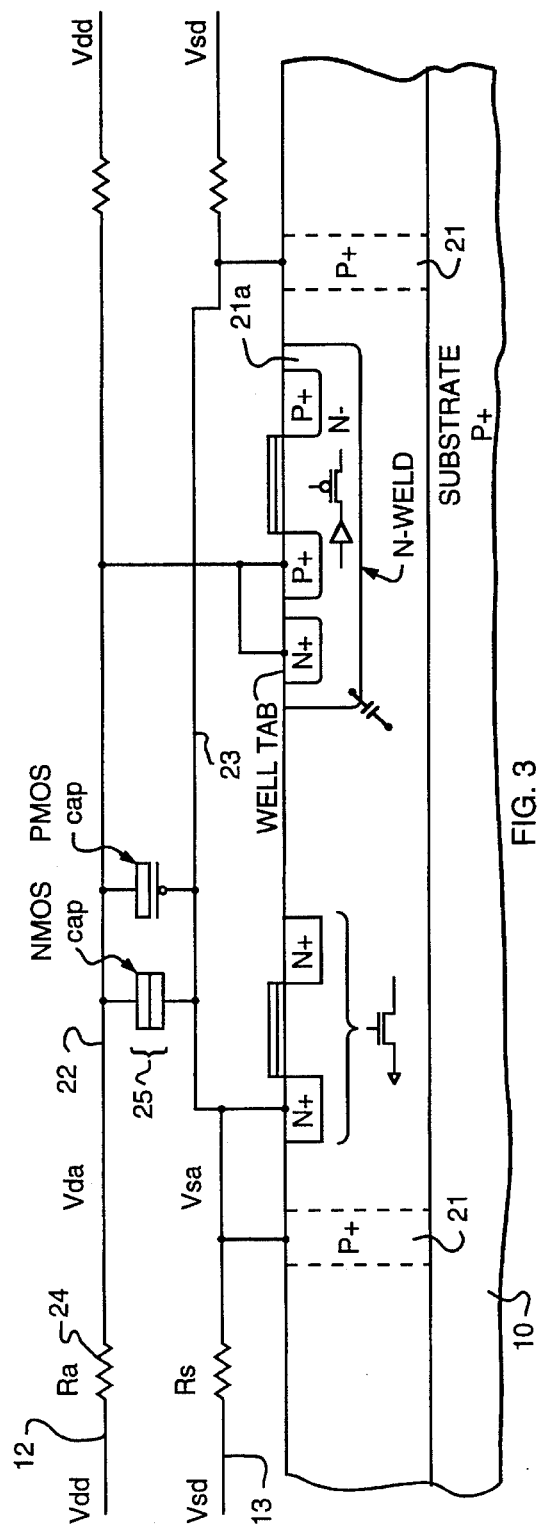

NOISE-FREE ANALOG ISLANDS IN DIGITAL INTEGRATED CIRCUITS

This is a continuation of application Ser. No. 07/909,550, filed on Jul. 6, 1992, entitled, NOISE-FREE ANALOG ISLANDS IN DIGITAL INTEGRATED CIRCUITS.

BACKGROUND OF THE INVENTION

This invention relates to semiconductor integrated circuit devices, and more particularly to integrated circuits having both digital and analog functions on the same chip.

In digital integrated circuit devices such as microprocessors or memory, analog circuits are sometimes needed to achieve functions not realizable through strictly digital means. For example, DRAM devices have used temperature compensation circuits with bipolar devices to implement internal power supply generators and slew rate control circuits.

Analog functions, however, are particularly susceptible to noise which is prevalent in large digital chips. This impediment has been prohibitive to the use of analog circuits to enhance microprocessor performance. For example, phase locked loops would be quite useful to control clock slew on microprocessor chips, where component density has increased and clock distribution has become more difficult.

The digital designer has avoided utilizing analog circuits in digital chips, however, mainly because these circuits tend to malfunction in noisy "digital" environments. The stability of feedback loops (as used in phase locked loops) is deteriorated when noise rejection is a design requirement.

Previously, attempts have been made to alleviate the problems of using analog circuits on digital chips. For example, in U.S. Pat. No. 4,857,770, for "output Buffer Arrangement for Reducing Chip Noise Without Speed Penalty" issued to Hamid Partovi, a method was disclosed which used routing an analog level to different localities, with capacitive coupling to the appropriate rail. In U.S. Pat. No. 4,628,343, for "Semiconductor Integrated Circuit Device Free From Mutual Interference Between Circuit Blocks Formed Therein" a device uses an isolation region between different circuit blocks, with connection between blocks being by way of a shielded contact hole in conductor layer having substantially zero impedance.

SUMMARY OF THE INVENTION

According to one embodiment of the invention, an integrated circuit chip has digital circuit functions on most of its area, but also has one or more islands for analog functions. An island may be defined by a surrounding heavily-doped region in the face of the chip. The voltage supply for an analog island is obtained from the supply lines for the chip, which service all of the digital functions, so the analog supply must be isolated from the digital supply voltage. Since analog signals are predominantly low frequency compared to the digital transients, this isolation is for high frequencies, using resistive decoupling along with capacitive coupling to substrate reference (to filter out high frequencies). Analog signals are brought into the island by a similar arrangement; series resistive decoupling and capacitive coupling to substrate reference are employed for the input signal lines. Analog signals generated within the island are coupled to the area outside the island on the chip face by either converting to digital in an A-to-D converter, or by a differential arrangement which accounts for differences that may exist between digital and analog supply voltages. The differential circuit may have a pair of matched inputs, one side supplied by the analog voltage supply and the other by the digital voltage supply, and a differential amplifier generating the output signal and also fed back to the one side of the matched input.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

FIG. 1 is a diagram of a top view of a semiconductor chip having mostly digital circuitry but having an isolated analog island, according to one embodiment of the invention;

FIG. 2 is a timing diagram of supply voltages in the chip of FIG. 1;

FIG. 3 is an elevation view in section of the semiconductor chip of FIG. 1, taken along the lines 3—3 of FIG. 1;

DETAILED DESCRIPTION OF SPECIFIC EMBODIMENT

Figure 4:
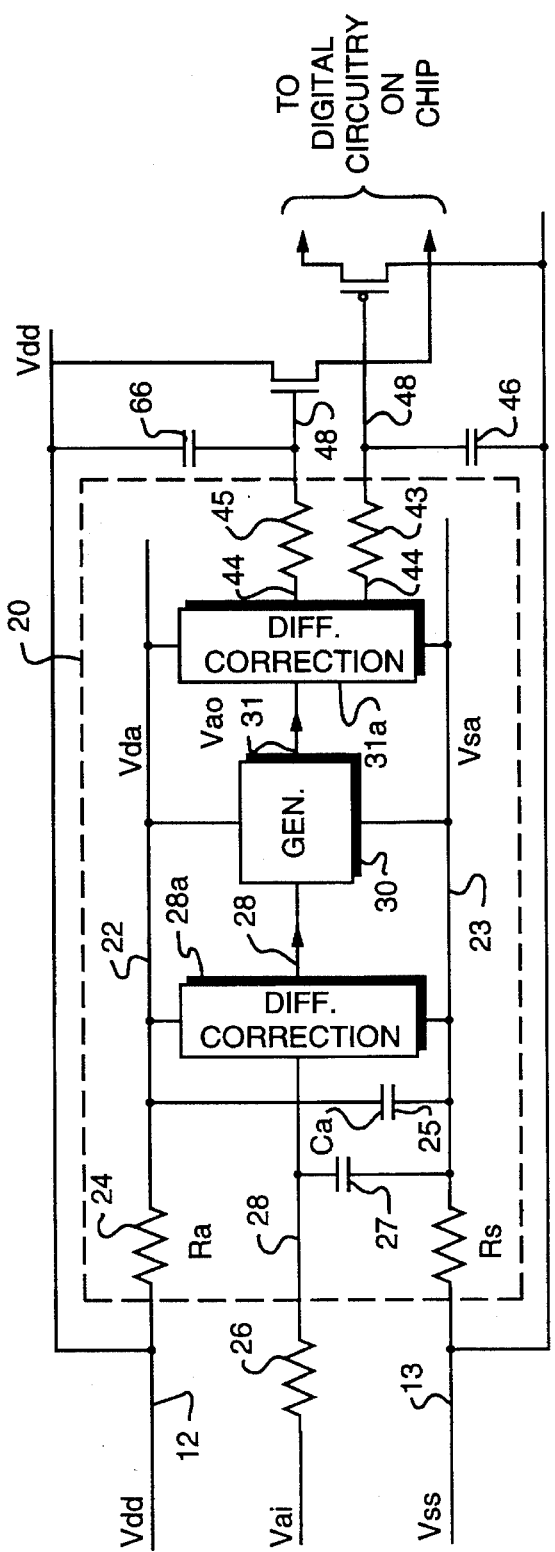
FIG. 4 is an electrical diagram of a supply voltage circuit used in the device of FIG. 1, according to one embodiment.

Referring to FIG. 1, an integrated circuit chip 10 is shown which is of the type containing mostly digital circuitry; the chip may be a microprocessor or a RAM, for example, or any of a wide variety of such circuits. A number of bonding pads 11 are on the face of the chip for signal input and output (data, address and control signals) and power supply inputs, in the usual manner. A positive voltage supply Vdd is applied to one of the pads 11 and ground or Vss is applied to another, in a typical device. Often, both the positive supply Vdd and Vss are applied separately to a number of the pads 11 to reduce the current-carrying requirements of any one pad, reduce resistance, and reduce inductive effects. A Vdd input is connected to metallization 12 for routing the positive supply to various points throughout the face of the chip where it is needed, and the Vss supply is similarly routed by metallization 13.

The actual supply voltages seen by a transistor device in the chip vary from the nominal values due to events occurring within the circuitry. Referring to FIG. 2, the nominal values of Vdd and Vss may be 3.3 V and 0.0 V, for example, and these would be the actual values seen by a transistor device in a quiescent state, time t0. However, at time t1, there may be, for example, sixty-four output drivers or 512 sense amplifiers activated at one time, presenting a large current drain on the supply for a short time. Resistance and inductance in the metallization 12 and 13, and in the wires bonded to the pads 11 going to the supply, as well as internal impedance of the supply itself, may cause the Vdd and Vss lines as shown by traces 14 and 15 in the Figure to exhibit bumps 16 and 17. The "ground" voltage will rise slightly and the positive supply will dip slightly at time t1 due to this effect. These bumps may not be a problem in digital circuitry since the magnitudes of the bumps may be kept below the ranges of switching between "0" and "1" levels, and/or may be below threshold levels. If analog circuits such as differential amplifiers are included in the chip 10, however, the bumps 16 and 17 may be indistinguishable from signal levels. A compensation capacitor to smooth out the bumps is undesirable because it is non-differential and degrades functionality.

According to the invention, an island 20 for analog functions is included in the chip 10. In order to isolate the analog circuitry within the perimeter 21 of the island 20 from the surrounding digital circuitry, the perimeter 21 may be a deep P+ diffusion as seen in FIG. 3, where in this example the substrate used to form the chip 10 is P+ and the MOS circuitry is formed in a P− epitaxial layer. The deep P+ region shorts $V_{SA}$ to $V_{substrate}$. Or, the entire chip 10 can be P− and the P+ diffusions penetrate deep into the face (or all the way through) to isolate the island. Of course, other types of isolation can be used, such as oxide isolation, trench isolation, SOS (silicon on sapphire), etc.

Included within the island 20 is an N-well 21a as seen in FIGS. 1 and 3. P-channel transistors of the CMOS circuitry within the island are created by P+ source/drain inplants in the N-well, and N-channel transistors are created by N+ source/drain implants in the area within the island but outside the N-well. Of course, there may be more than one N-well within the analog island, depending upon what circuitry is needed within the island. Also, there may be more than one analog island on a chip 10.

Isolated versions of the supply voltages are created for the analog island 20. A positive supply Vda is generated for line 22 and a ground voltage Vsa is generated for line 23. As seen in FIG. 4, a signal input Vai is applied to the island from the digital part of the chip face or from one of the pads 11, and an output Vao is coupled from the island to the digital parts of the chip or to a pad 11. These supply lines 22 and 23 are isolated from the Vdd and Vss lines 12 and 13, as will be explained, and the inputs and outputs Vai and Vao are isolated from the effects of variations in the supply lines.

Referring to FIGS. 3 and 4, the Vda supply rail 22 is resistively decoupled from the Vdd line 12 by Ra, resistor 24, and is capacitively coupled to the Vss line 13 by Ca, capacitor 25. The ground supply Vsa is resistively decoupled from Vsd by resistor Rs. The value of the Ra resistor 24 is determined based on (1) the average current (mostly DC) of the analog circuits within the island 20, perhaps about 5-ma, and (2) the drop allowed on Vda according to design requirements, perhaps 200-millivolt. Thus, with Ia≦5-ma and ΔVdd≦200-millivolt, then Vdd−Vda=ΔVdd=200-mV/Ia so Ra≦40Ω

The capacitance Ca is selected such that high frequency components of noise on power supply lines are rejected f≦250-MHz RaCa≧4-ns→Ca≧4-ns/.04K so Ca≦100pf The ground level Vsa for the island is the same as that of the substrate, $V_{substrate}$, but is not necessarily equal to $V_{SS}$, i.e., Vsa=$V_{substrate}$≠Vss.

The supply and ground levels Vda and Vsa of the analog islands are thus immune to noise bounces on Vdd, or in particular Vdd as compared with Vss as reference, such that $$\frac{d(Vda - Vsa)}{dt} \cong 0$$

The inputs to the analog islands 20 will include digital inputs and analog inputs. The digital inputs such as clocks and other control circuits will be routed into the island in the common way. For example, a polysilicon or metal strip interconnect is routed over the ring 21 from the digital area of the chip face to the interior of the analog island 20. The analog inputs, however, must be routed in the same manner as Vda and Vsa were routed. So, the analog inputs are resistively decoupled and capacitively coupled to the island's supply rails, using resistor 26 and capacitor 27 of FIG. 4.

The analog input Vai is applied by line 28 through a difference correction circuit 28a to a utilization circuit 30 within the analog island 20, which functions to generate the desired analog output voltage Vao on line 31. This generator circuit 30 may be any type of analog circuit ordinarily used in an IC chip. It uses the supply voltage Vda on line 22 and the ground Vsa on line 23. The circuit 30 produces an analog output Vao on line 31 which is coupled to outside the island 20 by a difference correction circuit 31a as seen in FIG. 5, for example.

Figures 5, 6:
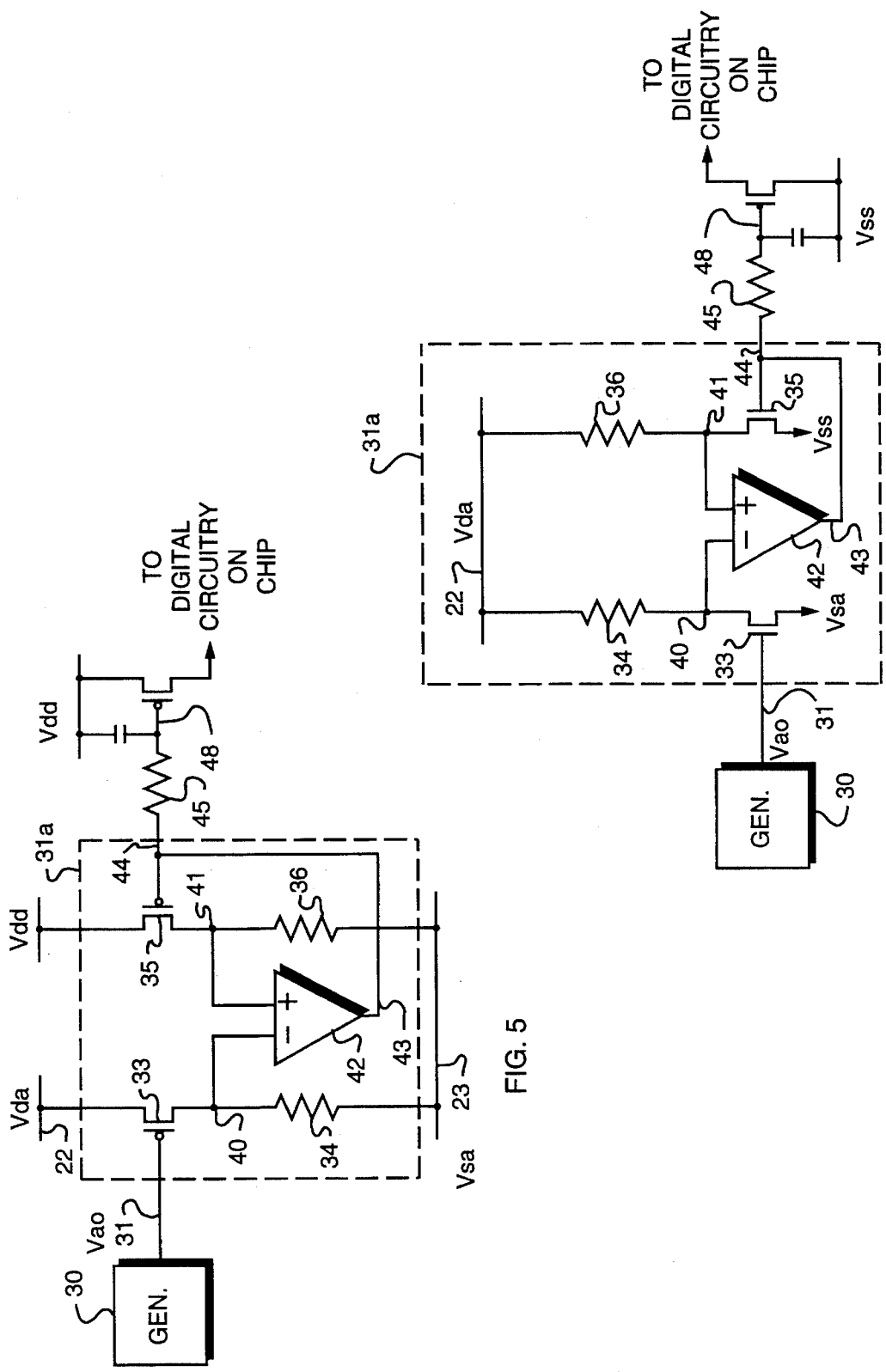
FIG. 5 is an electrical diagram of an analog output circuit used in the device of FIG. 1, according to one embodiment.
FIG. 6 is an electrical diagram of another embodiment of the circuit of FIG. 5.

Referring to FIG. 5, in the difference correction circuit, the analog output voltage Vao on line 31 is connected to the gate of a P-channel transistor 33 which has its source-to-drain path connected in series with a resistor 34, across the Vda to Vsa supply between lines 22 and 23. A matching reference circuit includes a P-channel transistor 35 and series resistor 36 connected across the Vdd to Vss supply. The sources of the two transistors 33 and 35 at nodes 40 and 41 are connected to the inputs of an op-amp 42 functioning as a differential amplifier, and the output 43 is connected to a node 44 which is connected to the gate of the transistor 35. The node 44 is also decoupled by resistor 45 and coupled to Vdd by capacitor 46 to remove high-frequency components, producing an output on line 48 which has any differential caused by differences between Vdd and Vda removed. That is, the analog output voltage on line 48 will be faithfully referenced to Vdd, rather than Vda. Any variations in Vdd of a low-frequency (analog) type, compared to Vda, will be compensated by a detected differential between nodes 40 and 41, producing a voltage on lines 43 that tends to drive the gate of P-channel transistor 35 in such a way as to track the signal-level changes occurring on Vao on the line 31. The circuit of FIG. 5 is constructed to be balanced, i.e., the resistors 34 and 36 are of equal value, and the size of the P-channel transistors 33 and 35 are the same. The output on line 48 for biasing P-channel devices is referred to as $V_{(aop-buf)}$, and the relationship to Vao is defined by:

Vaop−Vda=$V_{(aop-buf)}$−Vdd

The analog output levels produced by the output arrangement of FIG. 5 can be routed within the chip by having the lines such as line 48, resistively decoupled from the analog island, coupled to Vdd by a method such as running it over a sacrificial well tied to Vdd, for example; this is for levels used to drive the gates of P-channel transistors in the area outside the island 20.

For an analog output voltage Vao on line 31 from the generator 30 needed to drive the gate of an N-channel transistor outside the island 20, the circuit of FIG. 5 is reversed, i.e., the transistors 33 and 35 are N-channel devices and positioned on the Vss and Vsa side, and the resistors 34 and 36 are on the Vda side, as seen in FIG. 6. In this case, the output 48 is coupled by capacitor 46 to Vss instead of Vdd.

Figure 7:
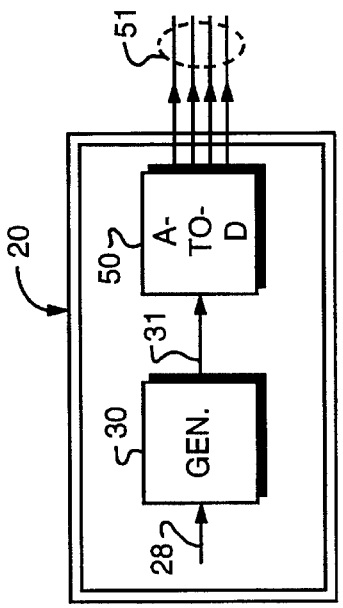
FIG. 7 is an electrical diagram in block form of another analog output arrangement, an alternative to that of FIGS. 5 and 6.

Alternatively, the analog voltage output Vao from the generator 30 may be applied to an analog-to-digital converter 50 as seen in FIG. 7, and thus coupled out of the analog island 20 as a digital signal level on lines 51. As before, the lines 51 can be routed within the chip 10, or applied to output pads 11 for coupling off-chip, using output buffers if needed.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. An integrated circuit device formed at a face of a semiconductor body, said integrated circuit device having both digital and analog circuit functions operating therein, comprising:

a positive voltage supply line and a ground supply line at said face;

a source of an analog input voltage at said face;

an area of digital circuitry at said face;

an island of analog circuitry at said face, said island being physically surrounded by an isolating region adjacent to said area of digital circuitry, said island including therewithin:

a) an analog voltage supply line resistively coupled to said positive voltage supply line and capacitively coupled to said ground supply line;

b) an analog function generator receiving said analog input voltage and connected to said analog voltage supply line to produce an analog output voltage in response to said analog input voltage; and c) an analog output circuit receiving said analog output voltage and producing an output on an analog driver line which is proportional to said analog output voltage but is isolated therefrom, said analog output circuit including a matched differential circuit receiving said analog output voltage as one input and said analog driver line as a second input, an output of said differential circuit being applied to said analog driver line.

2. A device according to claim 1 wherein said isolating region includes a heavily-doped region extending into said face.

3. A device according to claim 1 wherein said positive voltage supply line and said ground supply line are each separately connected to pads at said face for connecting to external power supply terminals, and are also connected to devices within said area of digital circuitry.

4. A device according to claim 1 wherein said matched differential circuit is supplied at said one input by a voltage from said analog voltage supply and is supplied at said second input by a voltage from said positive voltage supply line.

5. A device according to claim 1 wherein said differential circuit includes first and second transistors each having a source-to-drain path and a gate, and first and second resistors; said first resistor being connected in series with said source-to-drain path of said first transistor on said one side with said analog signal being connected to the gate of said first transistor; said second resistor being connected in series with said source-to-drain path of said second transistor on said other side with said analog driver line being connected to the gate of said second transistor.

6. A device according to claim 5 wherein said differential circuit includes a differential amplifier having first and second inputs, said first input being connected to a node between said source-to-drain path of said first transistor and said first resistor, said second input being connected to a node between said source-to-drain path of said second transistor and said second resistor, an output of said differential amplifier being said output of said differential circuit.

7. An integrated circuit device formed at a face of a semiconductor body, said integrated circuit device having both digital and analog circuit functions operating therein, comprising:

a positive voltage supply line and a ground line at said face;

a source of an analog input voltage at said face;

an area of digital circuitry at said face;

an island of analog circuitry at said face, said island being physically surrounded by an isolating region adjacent to said area of digital circuitry, said island including therewithin:

a) an analog voltage supply line resistively coupled to said positive voltage supply line and being capacitively coupled to said ground supply line;

b) an analog function generator receiving said analog input voltage and connected to said analog voltage supply line to produce an analog output voltage in response to said analog input voltage; and c) an analog output circuit receiving said analog output voltage and producing a digitized output for use by digital circuitry in said digital area, said analog output circuit including an analog-to-digital converter.

8. A device according to claim 7 wherein said isolating region includes a heavily-doped region extending into said face.

9. A device according to claim 7 wherein said positive voltage supply line and said ground supply line are each separately connected to pads at said face for connecting to external power supply terminals, and are also connected to devices within said area of digital circuitry.

* * * * *